United States Patent [19]

Goodwin

[11] Patent Number: 4,665,359
[45] Date of Patent: May 12, 1987

[54] METHOD AND APPARATUS FOR DETECTING TAMPERING WITH A METER HAVING AN ENCODED REGISTER DISPLAY

[75] Inventor: R. Wendell Goodwin, Dunwoody, Ga.

[73] Assignee: Sangamo Weston, Inc., Norcross, Ga.

[21] Appl. No.: 650,151

[22] Filed: Sep. 13, 1984

[51] Int. Cl.⁴ .............................................. G01R 1/00
[52] U.S. Cl. .................................................... 324/110
[58] Field of Search ................................... 324/96, 110; 340/870.29, 637, 688, 672; 73/275, 198, 861.77; 250/231 SE

[56] References Cited

U.S. PATENT DOCUMENTS

| | | | |
|---|---|---|---|
| 3,833,901 | 9/1974 | Fowler | 340/347 P |
| 3,846,788 | 11/1974 | Calabro et al. | 340/870.29 X |
| 4,104,588 | 8/1978 | Westberry | 324/110 |
| 4,190,767 | 2/1980 | Crouse | 250/231 SE |
| 4,264,897 | 4/1981 | Farnsworth | 340/870.29 |
| 4,321,531 | 3/1982 | Marshall | 340/637 X |
| 4,422,026 | 12/1983 | Starai | 318/640 |
| 4,472,629 | 9/1984 | Ort | 250/237 G |
| 4,475,034 | 10/1984 | Maddox et al. | 250/231 SE |
| 4,476,457 | 10/1984 | Kondo | 340/347 P |
| 4,514,683 | 4/1985 | Deibert et al. | 324/110 |

FOREIGN PATENT DOCUMENTS

| | | | |
|---|---|---|---|
| 124434 | 11/1984 | European Pat. Off. | 324/110 |
| 2335942 | 1/1975 | Fed. Rep. of Germany | 250/231 SE |
| 2155673 | 9/1985 | United Kingdom | 324/96 |

OTHER PUBLICATIONS

Ward, S. et al., "Diode Laser Communications for Remote Utility Meter Reading", Proc. SPIE, vol. 150, Laser & Fiber Optics Communications (1978), pp. 103–107.
IBM Technical Disclosure Bulletin, vol. 16, No. 9, Feb. 1974, "Calibration of Analog Channels", Kennedy, P., p. 2771.

Primary Examiner—Reinhard J. Eisenzopf
Assistant Examiner—Stephen M. Baker
Attorney, Agent, or Firm—Dale Gaudier

[57] ABSTRACT

Tampering with an optically encoded meter display register or metering mechanism can be readily detected by comparing the quantity shown by the meter display with the encoded values of the optical encoders. A discrepancy is indicative of tampering with the register display. Any tampering with the optical encoders or the metering mechanism can be detected by comparing the present position of the encoders with that of a previous position and generating a signal indicative of tampering when these positions have a predetermined relationship to each other.

8 Claims, 10 Drawing Figures

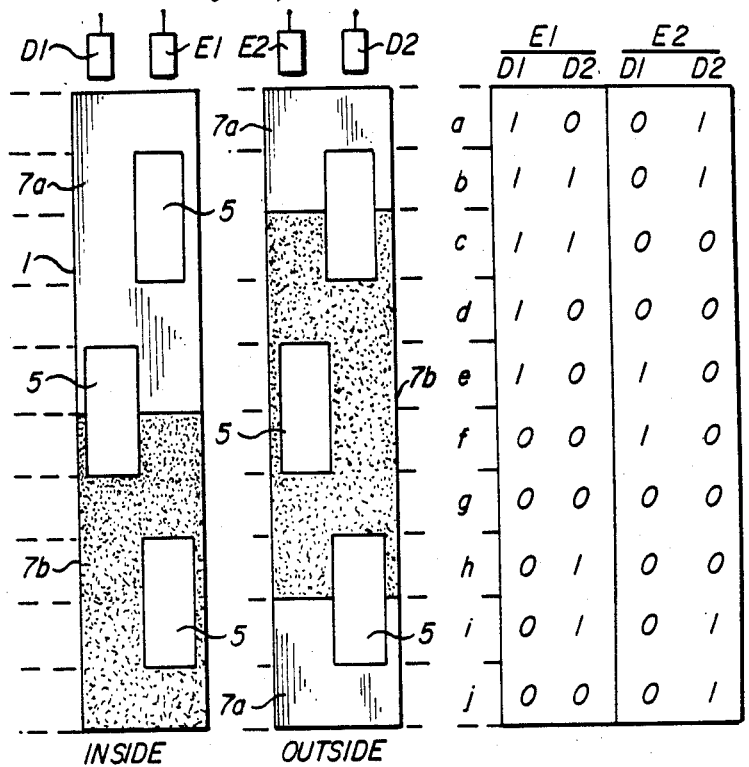
FIG. 2a  FIG. 2b  FIG. 2c
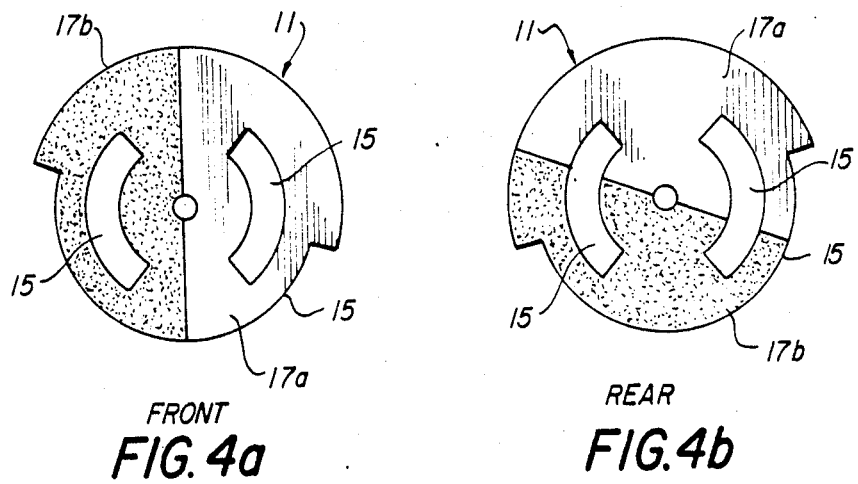
FRONT
FIG. 4a
REAR
FIG. 4b

METHOD AND APPARATUS FOR DETECTING TAMPERING WITH A METER HAVING AN ENCODED REGISTER DISPLAY

CROSS REFERENCE TO RELATED APPLICATIONS

This application contains subject matter related to copending applications Ser. No. 650,031, filed Sept. 13, 1984, now U.S. Pat. No. 4,588,982, entitled "Optical Shaft Encoder", now U.S. Pat. No. 4,588,982, and Ser. No. 650,030, filed Sept. 13, 1984, entitled "Method of Initializing an Optical Encoder", which are assigned to the assignee of the present application.

BACKGROUND OF THE INVENTION

The present invention relates to the field of optical shaft encoders, and more particularly to a method and apparatus for detecting tampering with a meter having an encoded register display.

Optical shaft encoders are well known for their use in determining the angular position of a rotating shaft. Such optical shaft encoders are used in various types of machinery and machine tools where information concerning the precise angular relationship between a shaft and another component is needed.

Optical shaft encoders generally consist of an optical shutter, such as a disk or drum, which is rigidly attached to the shaft whose position is to be determined. The optical shutter is used to modulate the transmission of light between a light emitter (e.g. a light emitting diode) and a light detector (e.g. a photodiode or phototransistor). This modulation may be transmissive, in which case the optical shutter has a pattern of slots formed on its surface and the light emitter and light detector are arranged on opposite sides of the optical shutter. Alternatively, the modulation may be reflective, in which case the optical shutter has a pattern of reflective (e.g. white) and absorptive (e.g. black) areas on its surface and the light emitter and light detector are arranged adjacent one another on the same side of the optical shutter.

In general, the resolution of a optical shaft encoder depends on the number of light emitting and light detecting devices used. For example, using one emitter and one detector, whose output will be either a "1" (on) or "0" (off), will give an angular resolution of ½ a revolution of the shaft. If two emitters and two detectors are used, the detector outputs can have up to four different states (e.g. 00, 01, 10, or 11) and thus will be able to resolve ¼ of a revolution. Three emitters and three detectors can have eight different states and resolve ⅛ of a revolution; four emitters and four detectors can have sixteen different states and resolve 1/16 of a revolution, etc.

In co-pending application Ser. No. 650,031, filed Sept. 13, 1984, entitled 'Optical Shaft Encoder' an optical shaft encoder is disclosed which utilizes an optical shutter, such as a disk or drum, mounted to a shaft and having a pattern of light transmissive and light reflective/absorptive areas formed thereon. A first light emitter and a first light detector are arranged on one side of the optical shutter and a second light emitter and a second light detector are arranged on the opposite side of the optical shutter facing the first light emitter and detector. Through an appropriate choice of the patterns of light transmissive and reflective/absorptive areas formed on the optical shutter, and by alternately energizing the light emitters, up to 16 different angular positions of the optical shutter and shaft with respect to the light emitters and light detectors may be resolved.

Optical shafts encoders of the foregoing types have been proposed for use in detecting the position of the shafts which drive a clock-dial type register display such as used in a gas, water, or electricity meter. Such a display usually consists of a dial face similar to that used on a clock and having the numerals 0-9 printed thereon. A pointer is removably attached to each shaft, and each shaft is in turn linked to the metering mechanism of the meter. The shaft and pointer are normally rotated by an amount that is proportional to the amount of billable commodity (e.g. gas, water, electricity) being monitored by the meter.

One problem often encountered with such metering devices is that the register display can be easily tampered with in order to give a false reading of the amount of the commodity which has been measured by the meter. Such tampering can be carried out simply by moving the dial pointers into new positions while the shaft positions remain unchanged. Also, in some types of electricity meters, the meter can be caused to run backwards by simply removing the meter from its socket and replacing it upside-down for a certain period of time. The tamperer later returns the meter to its normal, upright position. The register display runs backwards while upside-down and thus will show a lower amount of electrical power energy being consumed than is actually the case.

SUMMARY OF THE INVENTION

The present invention concerns a method and apparatus for detecting tampering with a meter having an encoded register display, the meter being of the type for measuring and displaying the consumption of a commodity such as gas, water or electricity, and including means for measuring the commodity and mechanical register display means for displaying the amount of commodity so measured. In particular, the means for detecting tampering with the measuring means comprises an optical shutter mounted to a drive shaft associated with each register display position of the display means, light emitter means and light detector means associated with each optical shutter for respectively illuminating and detecting a predetermined pattern of code markings formed on the optical shutter, and electrical circuit means responsive to the status of the light emitter means and light detector means for determining the angular position of each optical shutter relative to its associated light emitter means and light detector means from the detected predetermined pattern. The electrical circuit means further includes means for determining the direction of change of the angular position of each optical shutter, and means for generating a signal indicative of tampering with the measuring means if the direction of change is not in a predetermined direction.

With the foregoing arrangement, any tampering with the optical shutter or attempt to run the metering mechanism in a direction opposite to that which is normal, will be readily detected so as to generate a tamper indicating signal. For example, the display means may comprise a clock-dial register having a plurality of display positions, each display position including a drive shaft connected to the measuring means and a dial pointer attached to the drive shaft, such as is used to display the amount of a commodity consumed by a gas, water or electricity meter.

The electrical circuit means may further include means for storing signals representative of the current detected angular position of each optical shutter and for determining the direction of change of the angular position of each optical shutter relative to a previously detected position.

Preferably, the storage means is a non-volatile electrical memory. This enables the positions of the optical shutters to be retained in the event of a loss of power to the electrical circuit means.

The present invention also encompasses a method of detecting tampering with the meter mechanism or with the meter display register. Tampering with the display is detected by reading the quantity visually displayed by the mechanical register and comparing it with the signals generated by the optical encoders. Any discrepancy is indicative of possible tampering with the mechanical register display.

Tampering with the measuring mechanism of the meter is detected by storing, in electrical storage means associated with the optical encoder means, the values of signals indicative of the angular position of each shaft of the display means, subsequently detecting the current position of each shaft and generating signals having a value indicative thereof, comparing the value of the stored signals with those of the current position representative signals, and generating a signal indicative of tampering with the measuring means when the values of the stored and current position representative signals have a predetermined relationship to each other.

BRIEF DESCRIPTION OF THE DRAWING FIGURES

These and other features and advantages of the present invention will be readily apparent from the following description of the preferred embodiments of the invention and as shown in the accompanying drawing figures wherein:

FIGS. 2a and 2b are plan views of the inside and outside, respectively, of the optical shutter shown in FIG. 1 illustrating the patterns of light transmissive and light reflective areas formed thereon, and FIG. 2c is a chart illustrating the coding scheme represented by the patterns of FIG. 2a and 2b;

FIGS. 4a and 4b are plan views of the front and rear, respectively, of the optical shutter shown in FIG. 3 illustrating the patterns of light transmissive and light reflective areas formed thereon;

DETAILED DESCRIPTION OF THE PREFERRED EMBODIMENTS

Figure 1:
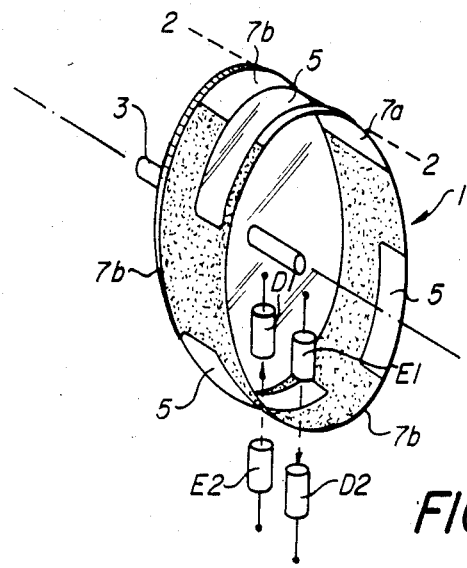
FIG. 1 is a perspective view of a first embodiment of an optical shaft encoder constructed in accordance with the principles of the present invention.

FIG. 1 shows an optical encoder for use in conjunction with the tamper detecting scheme of the present invention. The optical encoder includes an optical shutter 1 mounted to a shaft 3 for rotation therewith. As shown in FIG. 1, optical shutter 1 takes the form of a cylinder or drum. Optical shutter 1 includes a pattern of light transmissive areas 5 and light reflective and absorptive areas 7a and 7b, respectively, formed along the cylindrical surface thereof. As used herein, the term "reflective" is intended to mean areas having a reflectivity to light varying between 0% (i.e. totally absorptive) to 100% (i.e. totally reflective).

Also associated with the optical shutter are a first light emitter E1 and a first light detector D1, arranged adjacent one another within the cylinder defined by optical shutter 1, and a second light emitter E2 and a second light detector D2 arranged adjacent one another and opposite the first light emitter and light detector, E1 and D1, outside the cylinder defined by the optical shutter. Light emitters E1 and E2 may be, for example, light emitting diodes, while light detectors D1 and D2 may be, for example, photodiodes or phototransistors.

As shown in FIG. 1, the optical axes of detector D1 and emitter E2 are aligned with each other. Likewise the optical axes of light emitter E1 and detector D2 are aligned with each other.

FIGS. 2a and 2b show the inside and outside, respectively, of the cylinder forming optical shutter 1 as it would appear if broken along the line labeled 2—2 in FIG. 1 and unrolled. This illustrates the particular pattern of light transmissive areas 5 and light reflective and light absorptive areas 7a and 7b formed on the inside and outside surfaces of optical shutter 1.

As shown in FIG. 2c, if light emitters E1 and E2 are alternately energized, the output of light detectors D1 and D2 will depend upon the particular pattern of light transmissive and light reflective/absorptive areas which are positioned adjacent the first and second light emitters and light detectors. For example, in the position corresponding to the topmost areas of FIGS. 2a and 2b (labeled "a" in FIG. 2c), when the first light emitter E1 is turned on there will be an output from the first light detector D1 (defined to be a "1") because light from emitter E1 will be reflected by light reflective area 7a back to detector D1. However, there will be no output generated by detector D2 (defined to be "0") because the solid portions of optical shutter 1 block the light from emitter E1 from reaching detector D2.

Likewise, when light emitter E2 is energized, there will be an output from detector D2 due to the light being reflected from reflective area 7a, but no output from detector D1 because of the solid portion of the optical shutter prevents light from emitter E2 from reaching detector D1.

In the next position (labeled "b" in FIG. 2c), when light emitter E1 is energized there will be an output produced at detector D1 due to light reflecting off reflective area 7a. In addition, light from emitter E1 will travel through light transmissive area 5 to be detected by detector D2. When light emitter E2 is energized, however, only light detector D2 will be energized due to light reflecting off area 7a. The solid portion of optical shutter 1 disposed between light emitter E2 and light detector D1 prevents any light from reaching detector D1.

In the next position (labeled "c" in FIG. 2c), when light emitter E1 is energized there will be an output produced at detector D1 due to light reflecting off area 7a. Also, light from emitter E1 will travel through light transmissive area 5 to be detected by detector D2 when light emitter E2 is energized. However, neither detector D1 nor D2 will be energized because the solid light absorptive area 7b between emitter E2 and detector D1 prevents any light from reaching detector D1 or from being reflected back to detector D2. The outputs of light detectors D1 and D2 for the remaining positions (d-j) along optical shutter 1 are shown in FIG. 2c.

Figure 5:
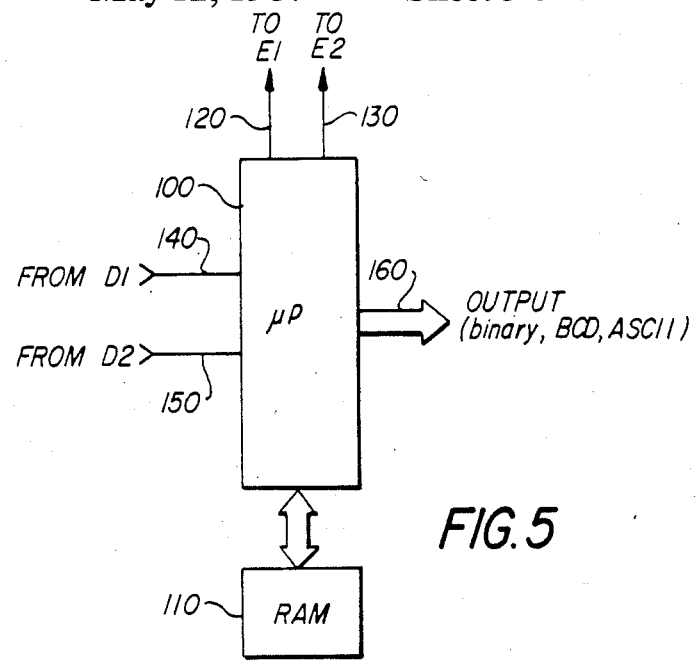
FIG. 5 is a schematic diagram of circuitry utilized in conjunction with the optical encoders shown in FIGS. 1 and 3.

The bit patterns shown in FIG. 2c, corresponding to predetermined angular positions of optical shutter 1 with respect to the light emitters and light detectors, can be readily detected and correlated by electrical circuitry, such as shown in FIG. 5, which is discussed in more detail below.

It will be appreciated that while 10 different positions are shown as being encoded in FIGS. 2a-2c (corresponding to an angular resolution of 36°), up to 16 positions may be encoded (corresponding to an angular resolution of 22.5°) using only two light emitters and two light detectors and an appropriate combination of light reflective/absorptive and transmissive areas arranged on the optical shutter. This is because a total of 4 bits of information (e.g. the two different outputs available from detectors D1 and D2 based on the alternate energization of emitters E1 and E2) are available. This results in a total of $2^4 = 16$ unique states the outputs of detectors D1 and D2 can take in conjunction with the status ("on" or "off") of light emitters E1 and E2.

Preferably, the particular pattern of light transmissive and light reflective/absorptive areas provided on optical shutter 1 are selected so that movement of the optical shutter relative to the pairs of light emitters and light detectors from one position to the next results in only one bit changing in the output pattern of detectors D1 and D2 (see FIG. 2c). This type of encoding scheme is called Gray coding. This type of encoding scheme has the advantage that since only one bit changes between each adjacent angular position, any other bit changes (such as if two bits change simultaneously) can be considered to be spurious. However, other types of encoding schemes may be utilized without departing from the basic principles of the invention.

Figure 3:
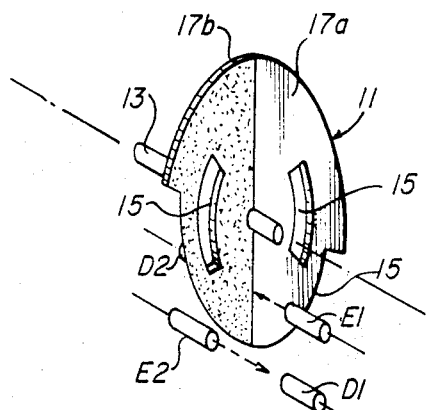
FIG. 3 is a perspective view of an alternative embodiment of an optical shaft encoder constructed in accordance with the principles of the present invention.

FIG. 3 shows an alternative embodiment for the optical encoder in which the optical shutter takes the form of a disk 11 mounted to a shaft 13, with the disk having a pattern of light transmissive areas 15 and light reflective and absorptive areas, 17a and 17b respectively, formed thereon. Light emitter E1 and light detector D1 are arranged adjacent one another on one side of disk 11, while light emitter E2 and light detector D2 are arranged adjacent one another on the opposite side of disk 11 with the optical axis of emitter E1 and being aligned with that of detector D2 and the optical axis of emitter E2 being aligned with that of detector D1.

FIG. 4a shows the pattern of light transmissive and light reflective/absorptive areas on the front of disk 11 (also seen in FIG. 3). FIG. 4b illustrates the pattern provided on the opposite side of disk 11. As in the arrangement shown in FIGS. 1 and 2a-2c, light emitters E1 and E2 are alternately energized and the outputs of detectors D1 and D2 change state in accordance with the particular angular position of disk 11 relative to the pairs of light emitters and light detectors. The particular pattern shown in FIGS. 4a and 4b is analogous to the pattern shown in FIGS. 2a and 2b, i.e. the outputs of detectors D1 and D2 will follow a Gray code pattern as code disk 11 is rotated past the light detectors while the light emitters are being alternately energized.

FIG. 5 shows one type of circuit which may be utilized for energizing light emitters E1 and E2 and detecting the outputs of light detectors D1 and D2. The circuit comprises a microprocessor 100 and a random access memory (RAM) 110 connected thereto. Microprocessor 100 includes at least a pair of outputs 120 and 130 which are connected to light emitters E1 and E2, respectively. Microprocessor 100 further includes a pair of inputs 140 and 150 connected to the outputs of light detectors D1 and D2, respectively.

It will be appreciated that microprocessor 100 is merely exemplary of one type of control circuitry which may be utilized in practicing the present invention. The microprocessor or control circuitry merely needs to have suitable input/output ports or connections for receiving the signals from light emitters D1 and D2 and for outputting control signals to light emitters E1 and E2. The microprocessor or control circuitry should also be capable of handling at least a four bit word. Not shown in FIG. 5 are such things as power supplies, ground connections, a clock and input/output buffering circuits, all of which are well known and need not be described here.

Microprocessor 100 is suitably programmed, such as through instructions stored in RAM 110 to cause the microprocessor to alternately energize light emitters E1 and E2 via signals supplied along lines 120 and 130, respectively, and to receive and detect the presence or absence of output signals from light detectors D1 and D2 along lines 140 and 150, respectively. RAM 110 includes a preprogrammed pattern corresponding to all the possible states of lines 120, 130, 140 and 150 (i.e. the states of light emitters E1 and E2 and light detectors D1 and D2) which correspond to predetermined positions of the optical shutter with respect to the light emitters and light detectors. For example, a pattern such as shown in FIG. 2c may be stored in RAM 110. Microprocessor 100 compares the various outputs and inputs along the lines 120, 130, 140 and 150 to determine which one of these predetermined patterns is present. Microprocessor 100 then generates an output signal at 160 having a value which is indicative of which one of these predetermined patterns, representing a particular angular position of the shaft and optical shutter, has been detected. This output signal may be binary, binary coded decimal, ASCII or of other conventional type. The output signal can be displayed or transmitted for utilization by other suitable computing devices. For example, if the optical encoder is to detect the position of the dial pointer in a meter display register (such as shown in FIG. 6), output 160 of microprocessor 100 may be used to electrically encode the dial reading for subsequent reading by the utility or for transmission to suitable meter reading or recording devices located at a site remote from the meter location.

The particular details of programming microprocessor 100 would, of course, depend upon the particular microprocessor employed, and would be within the oridinary skill of one familiar with the operation of such microprocessors. In addition, while the programming instructions and shaft-position representative patterns have been described as being present in RAM 110, it will be appreciated that theses instructions and patterns may be embedded or "burned in" into a permanent memory, such as a read only memory (ROM). In addition, some microprocessor designs include within their circuitry a certain amount of RAM and/or ROM so that a separate memory storage device, such as RAM 110, may be dispensed with when using such microprocessors.

It will be appreciated that microprocessor 100 may be arranged to receive the inputs from more than one pair of light detectors and to energize more than one pair of light emitters. Thus, multiple optical encoders may be operated by a single microprocessor. The current reading of the position of each optical encoder can be stored in a non-volatile memory so that an interruption of power to the microprocessor or control circuitry does not cause this current reading to be lost. The optical encoder and associated circuitry may be powered through a suitable connection to an electrical distribution network (such as where the encoder is used in an electricity meter) or it may be powered by means of a battery or a remote power supply when used in a metering device to having its own power source, such as is the case with gas and water meters.

Figure 6:
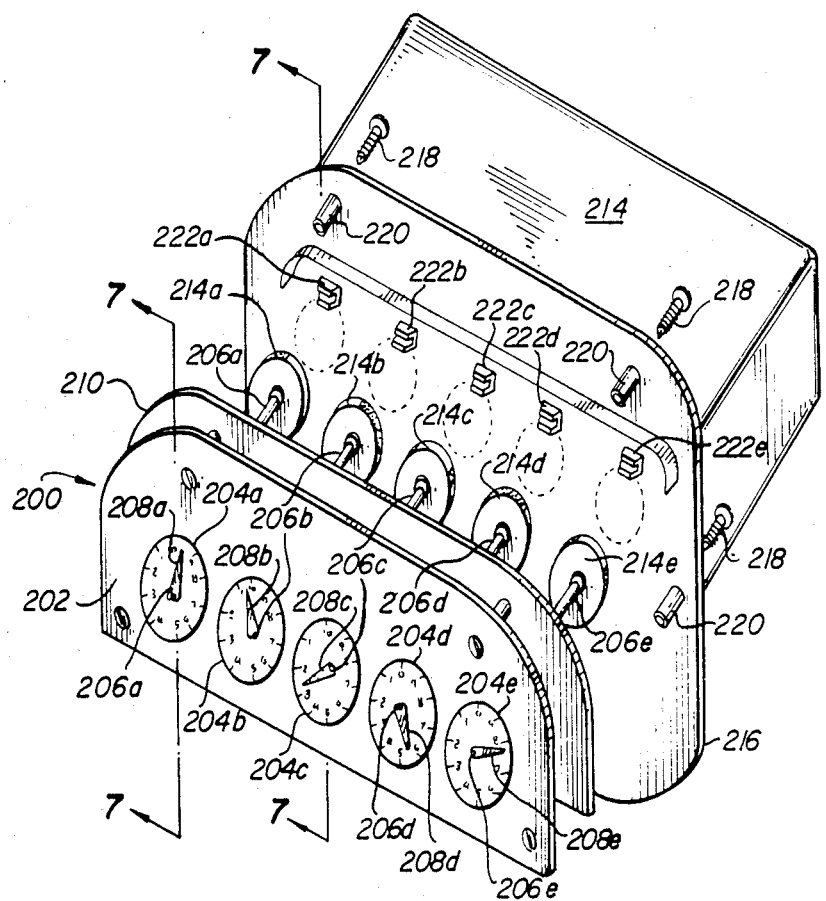
FIG. 6 is an exploded perspective view of a clock-dial register display showing the use of a plurality of optical encoders such as shown in FIG. 1.

An important feature of the present invention is that the optical shutter need not be mounted in any particular relationship to the position of its associated shaft or with respect to a pointer carried by the shaft, such as might be used in a dial-type register display (see FIG. 6 for example). More particularly, the optical shutter is mounted to its associated shaft in some arbitrary position and the light emitters and light detectors associated therewith are utilized to detect the particular code markings (the pattern of light transmissive and light reflective/absorptive areas) which are in proximity to the light emitters and detectors. This pattern is then recognized by microprocessor 100 and is assigned on arbitrary value, such as zero, to which all other angular positions of the optical shutter and its associated shaft are indexed. For example, the optical shutter of FIG. 1 may be arbitrarily mounted to its associated shaft with code markings corresponding to position "e" shown in FIGS. 2a-2c being adjacent the light emitters and light detectors. The pattern of light detector outputs for this position ("1010") is then assigned a value of zero or some other index value. Code markings associated with position "f" are then assigned a value of "1", position "g" a value of "2" etc., with position "d" being assigned a value of "9".

Of course, if some other position had been the one initially in proximity to the light emitters and light detectors during the initialization procedure, that position would have been assigned the "zero" or index position. After initialization, the pattern shown in FIG. 2c and the arbitrarily signed values, are preferably stored in a non-volatile memory (either RAM 110 or some other type of non-volatile storage means). This is so that the initialized position of the optical shutter will be retained in the event that microprocessor 100 or other control circuitry loses its source of power.

The above initialization method is especially useful when initializing a plurality of optical encoders associated with the shafts of a dial type register display, such as is used to display the consumption of gas, water or electricity. Such an arrangment is shown in FIG. 6.

A meter display register 200 inculdes a faceplate 202 having formed thereon a series of dial type display positions 204a-e. Circular display positions 204a-e each have the numerals 0-9 printed about the periphery thereof.

Associated with these these dial positions are dial shafts 206a-e to which dial pointers 208a-e are removably attached. Dial pointers 208a-e include a slot which engages respective shafts 206a-e at the point where they extend out of faceplate 202 and are secured to the dial shafts by crimping the slotted ends of the pointers to their associated shafts.

Figure 7:
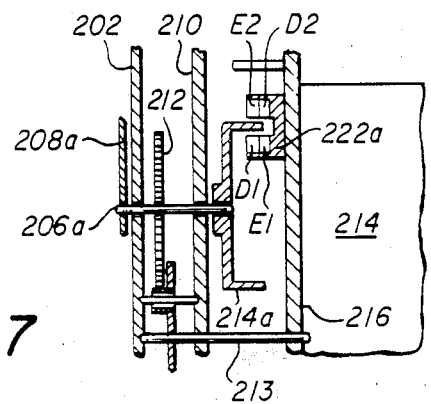
FIG. 7 is a cross-section of the register display shown in FIG. 6 taken along plane 7—7.

Meter display register 200 further includes a backplate 210 and a clockwork-like mechanism 212 (shown in abbreviated form in FIG. 7) associated with dial shafts 206a-e for rotatably driving the shafts. A drive shaft 213 (see FIG. 7) is used to drive the clockwork mechanism 212 in a well-known fashion in proportion to the amount of a billable commodity such as gas, water or electricity measured by a suitable measuring mechanism, shown generally at 214 in FIG. 6.

Such display registers are normally arranged so that each display position 204a-e constitutes one decade of the cumulative value of the quantity being measured by measuring mechanism 214. Thus, position 206e may be assigned to display units, position 204d representing tens, etc.

Associated with shafts 206a-e are optical shutters 214a-e constructed as described above with respect to FIGS. 1 and 2a-2c. Optical shutters 214a-e are glued or otherwise fixed attached to their respective shafts 206a-e . As described above, optical shutters 214a-e may be fixed in any arbitrary position with respect to a respective shafts 206a-e , without regard to the actual shaft position or that of its associated dial pointer.

A printed circuit board 216 is mounted to the rear of backplate 210 by means of a plurality of screws 218 and spacers 220. Printed circuit board 216 carries the control circuitry, such as shown in FIG. 5, and a plurality of light emitter/light detector packages 222a-e asociated with optical shutters 214a-e , respectively. When assembled together, the patterned cylindrical surfaces of the optical shutters is positioned between the light emitter and light detector units which comprise light emitter/light detector packages 222a-e (see FIG. 7).

Also mounted to printed circuit board 216 is a light shield 224 which surrounds the prephery of light emitter/light detector packages 222a-e and optical shutters 214a-e . Light shield 224 prevents stray light from interfering with the reading of the code markings on the optical shutters.

By utilizing the initialization method described earlier, the optical shutters need not be aligned in any particular position when they are mounted to their respective shafts. They can simply be mounted in any arbitrary position, the dial pointers 208a-e set to zero, and the particular position of each optical shutter is then detected and assigned a value of "0" to correspond with the initial setting of the dial pointers.

The above arrangement and technique can be further utilized to detect tampering with the meter display register or with the metering mechanism. One well-known technique for tampering with a meter display consists of removing the meter cover and moving the display dial pointers into new positions while the shaft positions remain unchanged. This is usually done so as to indicate a lower amount of the billable commodity consumed than is actually the case. Such tampering can be readily detected by the present invention simply by comparing the outputs of the optical encoders with the quantity proportedly being displayed by their associated mechanical display register. Since optical encoders 214a-e are permanently attached to their associated shafts 206a-e, any physical tampering with the optical encoders usually will be apparent. Further, microprocessor 100 or other control circuitry can be programmed to detect if the optical encoder has not moved incrementally from one position to the next. Thus, if an optical shutter is physically rotated more than one position away from its current position, such tampering can be readily detected by the microprocessor or control circuitry which can then generate or store a signal indicative of such tampering.

With certain electricity meters, it is possible to remove the meter from its socket and mount it upside-down in order to cause the meter to run backwards, and thus decreasing the display of the amount of electricity being consumed. After a certain amount of time, the tamperer then places the meter back in its normal upright position. However, this type of tampering can also be detected by the present invention by suitably programming the microprocessor or control circuitry to generate a tamper indicating alarm signal if the direction of rotation of the optical shutters is not as is expected. This can be done simply by comparing the current value representative of the quantity being displayed by the meter register with the value associated with a measurement made at some previous time. If the difference is not as is expected (e.g. the current value is less than the previous value) then the tamper indicating alarm signal is generated.

This tamper indicating signal can be used to illuminate a warning lamp or sound an audible alarm. Alternatively, the signal can be stored by the microprocessor or control circuit and displayed or transmitted only upon command of authorized personnel from the utility.

The foregoing description is not intended to be limitive or exhaustive but rather illustrative of the invention which is defined by the appended claims.

What is claimed is:

1. In a meter of the type for measuring and displaying the consumption of a commodity such as gas, water or electricity, including means for measuring the commodity and mechanical register display means for displaying the amount of the commodity so measured,
   means for detecting tampering with the measuring means comprising:
   an optical shutter mounted to a drive shaft associated with each register display position of said display means;
   light emitter means and light detector means associated with each optical shutter for respectively illuminating and detecting a predetermined pattern of code markings formed on the optical shutter; and
   electrical circuit means responsive to the status of the light emitter means and light detector means for determining the angular position of each optical shutter relative to its associated light emitter means and light detector means from the detected predetermined pattern,
   the electrical circuit means further including means for determining the direction of change of the angular position of each optical shutter, and means for generating a signal indicative of tampering with the measuring means if said direction of change is not in a predetermined direction, said direction determining means and signal generating means including means for comparing the value of the signal representative of the current angular position of the optical shutter with a previously stored value of a signal representative of a previous angular position of the optical shutter and for generating the tamper indicating signal when the compared values have a predetermined relationship with each other.

2. The meter of claim 1 wherein the display means comprises a clock-dial type register, having at least one clock-dial display including a drive shaft connected to the measuring means and a dial pointer attached to the drive shaft associated with each register display position.

3. The meter of claim 1 wherein the electrical circuit means includes means for storing signals representative of the current detected angular position of each optical shutter and for determining the direction of change of the angular position of each optical shutter relative to a previously detected position.

4. The meter of claim 3 wherein the means for storing signals is an electrical memory means.

5. The meter of claim 4 wherein the memory means is a non-volatile memory.

6. The meter of claim 1 wherein the tamper indicating signal is generated when the value of the current angular position representative signal is less than the value of the previously stored position representative signal.

7. In a meter of the type for measuring and displaying the consumption of a commodity such as gas, water or electricity, including means for measuring the commodity, mechanical register display means for visually displaying the amount of commodity so measured, the display means including one or more display positions, a shaft coupled to the measuring means and associated with each display position, and optical encoder means associated with each shaft for determining the angular position of each shaft and for generating a signal having a value indicative of such angular position,
   a method of detecting tampering with the display means, comprising the steps of:
   (a) reading a current position representative value visually displayed at each display position of the display means; and
   (b) comparing the value of the angular position representative signals generated by the optical encoder means with the displayed values read in step (a),
   whereby tampering with the display means is indicated if there is a discrepancy between the values compared in step (b).

8. In a meter of the type for measuring and displaying the consumption of a commodity such as gas, water or electricity, including means for measuring the commodity, mechanical register display means for visually displaying the amount of commodity so measured, the display means including one or more display positions, a shaft coupled to the measuring means and associated with each display position, and optical encoder means associated with each shaft for determining the angular position of each shaft and for generating a signal having a value indicative of such angular position,
   a method of detecting tampering with the measuring means, comprising the steps of:
   (a) storing, in electrical storage means associated with the optical encoder means, the values of the signals indicative of the angular position of each shaft of the display means;
   (b) subsequently detecting the current position of each shaft and generating signals having a value indicative thereof;

(c) comparing the values of the stored signals with those of the current position representative signals; and
(d) generating a signal indicative of tampering with the measuring means when the values of the stored and current position representative signals have a predetermined relationship to each other.

* * * * *